US006471562B1

United States Patent
Liu

(10) Patent No.: US 6,471,562 B1
(45) Date of Patent: Oct. 29, 2002

(54) LED DECORATIVE LIGHT BULB AND ITS MANUFACTURING METHOD

(75) Inventor: Hun-Huang Liu, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 0 days.

(21) Appl. No.: 09/397,163

(22) Filed: Sep. 16, 1999

(51) Int. Cl.⁷ .............................................. B29C 70/84
(52) U.S. Cl. ........................................ 445/60; 445/24
(58) Field of Search ................................ 445/1, 22, 23, 445/29, 35, 44, 60; 313/492–504, 512; 257/98, 99, 100, 721, 433

(56) References Cited

U.S. PATENT DOCUMENTS

| | | | | |
|---|---|---|---|---|
| 3,764,862 A | * | 10/1973 | Jankowski | 445/24 |
| 3,914,786 A | * | 10/1975 | Grossi | 257/98 |
| 4,195,330 A | * | 3/1980 | Savage, Jr. | 362/226 |
| 4,478,588 A | * | 10/1984 | Lockard | 445/22 |
| 4,630,183 A | * | 12/1986 | Fujita | 362/311 |
| 5,221,641 A | * | 6/1993 | Kurita et al. | 438/27 |
| 5,534,718 A | * | 7/1996 | Chang | 257/98 |
| 5,660,461 A | * | 8/1997 | Ignatius et al. | 362/241 |
| 5,887,967 A | * | 3/1999 | Chang | 362/226 |

* cited by examiner

Primary Examiner—Kenneth J. Ramsey
Assistant Examiner—Joseph Williams
(74) Attorney, Agent, or Firm—Graybeal Jackson Haley LLP

(57) ABSTRACT

An LED decorative light bulb and its manufacturing method are disclosed. The LED decorative light bulb has a frame with a negative pole and a positive pole separate from each other. After first copperplating, first nickeling, second copperplating, and second nickeling processes, a crystalplate is melted on the top of the negative pole and a lead extending therefrom is molten on the positive pole. The frame is then covered by epoxy resin and the Decorative light bulb is formed. The LED decorative light bulb is able to be installed in a conventional base which is then fitted in a conventional bulbholder. The crystalplate is higher than the upper edge of the base so that its light is not obscured by the upper edge.

4 Claims, 5 Drawing Sheets

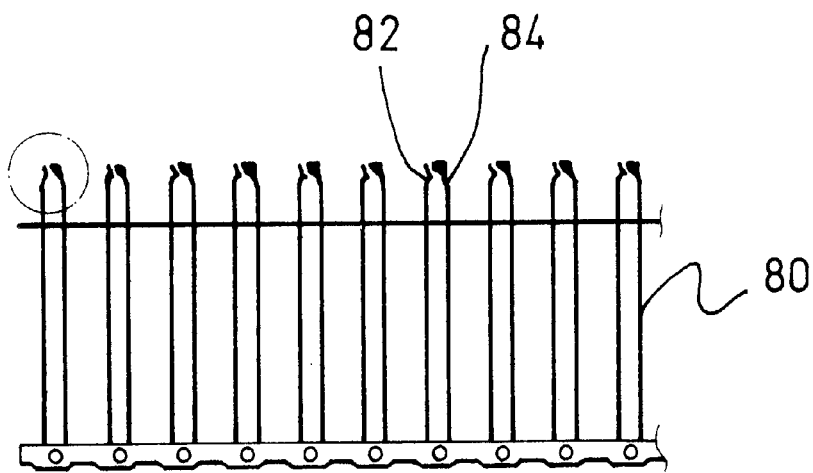
Fig. 6
PRIOR ART
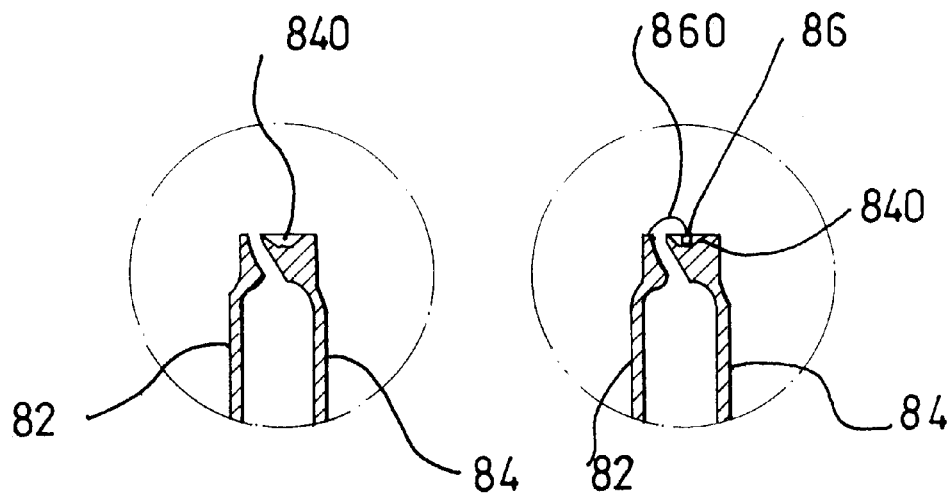
Fig. 7
PRIOR ART
Fig. 8
PRIOR ART

LED DECORATIVE LIGHT BULB AND ITS MANUFACTURING METHOD

BACKGROUND OF THE INVENTION

1. Field of the Invention

The present invention relates to an LED decorative light bulb and its manufacturing method, especially to an LED decorative light bulb being of a power-saving, safe and longlife type, and its manufacturing method being simple and cost-effective.

2. Description of Related Art

Decorative light bulbs are a very popular type of decoration throughout the world. An exploded perspective view of a present decorative light bulb is shown in FIG. 5. It comprises a bulb (90), a base (92), and a bulbholder (94). The bulb (90) is made of glass and contains a filament (900) therewithin which connects with a pair of feet (902); the feet (902) extend out of the bulb (90) and electrically connect to the base (92). In assembly, the bulb (90) is installed in the base (92) which then is inserted in the bulbholder (94) which has a cable (940) for electrical power supply.

The basic structure of the aforementioned decorative light bulb has not fundamentally changed since its appearance a long time ago, though many improvements have been provided by manufacturers of related art.

However, the above decorative light bulb has the following shortcomings:

1. power consumption. A power rate of 2.5~3.5 W of each tungsten-filamented decorative light bulb means that a considerable amount of power is consumed if used on a large scale.
2. danger of electric shock. The use of mains electricity to power the above decorative light bulbs means that the danger of electric shock always presents.
3. breakage. Glass bulbs are obviously fragile.
4. short life span. In fact, most of the above tungsten-filamented decorative light bulbs can be used for only one year.

Among the recently-developed sources of artificial light, LED bulbs are the most suitable one to be used to replace conventional tungsten-filament decorative light bulbs.

An LED bulb and its partially enlarged views are shown in FIGS. 6, 7, and 8. First, a frame (80) as shown in FIG. 6 is formed out of a steel plate. On each top of the frame (80), there is a positive pole (82) and a negative pole (84) which are fixed separately from each other. A cup (840) is formed in the top of the negative pole (84), as shown in FIG. 7. After four steps of plating in the following order: first copperplating, nickeling, second copperplating, and silverplating, the frame (80) is suitable for the assembly of a crystalplate (86). In assembly, molten crystalplate (86) is deposited in the cup (840), and then its lead (860) is attached to the positive pole (82) (as shown in FIG. 8). The whole frame (80) then can be put into a die and an epoxy resin is poured in (not shown in the figure). Finally, the frame (80) is removed from the die and an LED bulb is completed.

The producing procedure may vary from one manufacturer to another but the method they employ and the bulbs they produce are substantially similar. In terms of the manufacturing procedure and structure, none of the bulbs are suitable for use as an Decorative light bulb because of:

1. the high cost of producing equipment. The silverplating is employed to lower the resistance of the frame but its equipment is much more expensive than the one used for producing conventional tungsten bulbs.
2. the high cost of material. The lead (860) of the crystalplate (86) is made of pure gold.
3. the high cost of production. A cup (840) must be formed out on the top of the negative pole (84) which inevitably escalates the cost of producing.
4. the limitation of the structure. The crystalplate (86) has to be molten in the cup (840) of the negative pole (84) and therefore its light will be obscured by the wall of the cup. Furthermore, the crystalplate (86) is always placed at a lower portion of the present LED bulb which, if the LED bulb is put into a base, results in the crystalplate (86) being obscured by the base.

SUMMARY OF THE INVENTION

The main objective of the invention is to provide a manufacturing method of an LED decorative light bulb which, by certain arrangement of the manufacturing procedure and selection of materials, is able to greatly lower the manufacturing cost of the LED bulb to a level nearly of that of a tungsten bulb thereby making the LED bulbs commercially effective as Decorative light bulbs.

The other objective of the invention is to provide an LED decorative light bulb which has a crystalplate molten on the top of a negative pole which is higher than the base, and therefore is able to illuminate in all directions and will not be shielded by the base.

Other objectives, advantages and novel features of the invention will become more apparent from the following detailed description when taken in conjunction with the accompanying drawings.

BRIEF DESCRIPTION OF THE DRAWINGS

FIG. 6 is a schematic view of a frame of a present LED bulb;

FIG. 7 is a schematic enlarged cross-sectional view of a positive pole and a negative pole of the frame of the present LED bulb shown in FIG. 6; and, FIG. 8 is a schematic enlarged cross-sectional view of the positive pole and the negative pole shown in the FIG. 7 whereas the lead has been melted on the positive pole.

DETAILED DESCRIPTION OF PREFERRED EMBODIMENT

Though some similarities exist among the manufacturing procedures of the existed LED bulbs and the LED bulb of the invention, there are still differences in the arrangement of the steps and selection of materials. The manufacturing procedure of the LED bulb of the invention is as disclosed below:

a. a frame is formed having a positive pole and negative pole which are separate from each other by a certain distance;

b. the frame is copperplated;

c. the frame is nickelplated using nickel aminosulfate in the plating solution;

d. the frame is copperplated again;

e. the frame is nickelplated again using nickel aminosulfate in the plating solution, to finish the processing on the frame;

f. a crystalplate with a lead made of aluminum is put on the top of the negative pole of the frame;

g. the free end of the lead is molten on the positive pole by ultrasonic vibration;

h. the whole frame is put into a die;

i. epoxy resin is put into the die;

j. the epoxy resin is hardened by heating at a temperature of 130° C.;

k. the resin is allowed to cure for 8 hours;

l. the unnecessary part of the frame is removed leaving a pair of feet for electrical connection.

The LED Decorative light bulb is able to be installed in a conventional base, which in turn is able to be installed in a conventional bulbholder having an electric cable.

Without the silverplating step as in the conventional procedure, the above method copperplates twice and nickelplates twice which results in a significant cost saving. Generally speaking, the thickness of the copperplate layer of a conventional frame is about 1.5 $\mu$m, and the thickness of the silverplate layer is about 2.03~3.00 $\mu$m; the thickness of the copperplate layer of the present frame is about 1.5 $\mu$m and the thickness of the nickeling is about 2.00~3.00 $\mu$m. Though the double nickeling will increase the resistance of the frame from 1.07 m$\Omega$/2.5 mm to that of 0.98 m$\Omega$/2.5 mm of the silverplating, the increase is so slight that will not affect the conductivity of the frame.

In above procedure, a crystalplate is put on the top of the negative pole of the frame instead of putting it in a punched cup so that a punching step is eliminated thereby making the processing more simple.

Also in above procedure, the gold lead of the crystalplate is replaced by aluminum thereby lowering the cost of material used.

Furthermore, compared with the conventional nickel-sulfate nickeling, the present nickeling using nickel-aminosulfate in the plating solution makes the hardness of the frame lower whereas the hardness of the aluminum lead is greater than that of gold. This makes it possible to melt the lead by ultrasonic vibration instead of heating at a temperature of 250° C. thereby making the processing quicker and the products more stable.

Figure 1:
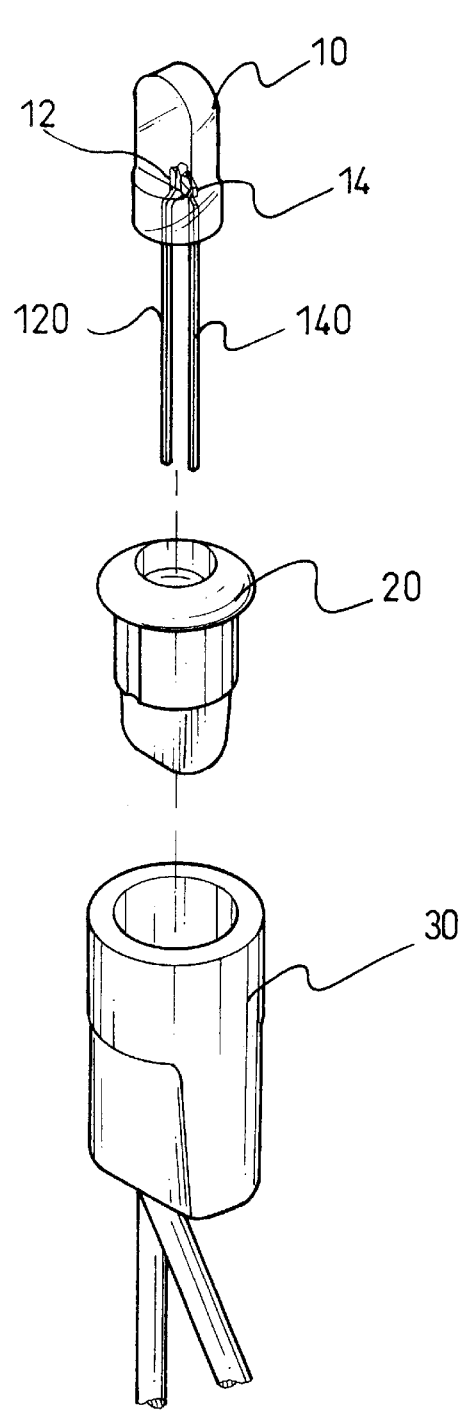
FIG. 1 is an exploded perspective view showing an LED decorative light bulb as well a base and a bulbholder.

With reference to FIG. 1, an LED Decorative light bulb (10), a base (20), and a bulbholder (30) are shown. The base (20) and the bulbholder (30) are both conventional so they will not be detailed described here. The invention, the LED Decorative light bulb (10) comprises a positive pole (12) and a negative (14) contained therein; a pair of feet (120, 140) extend downward respectively from the positive pole (12) and the negative pole (14).

Figure 2:
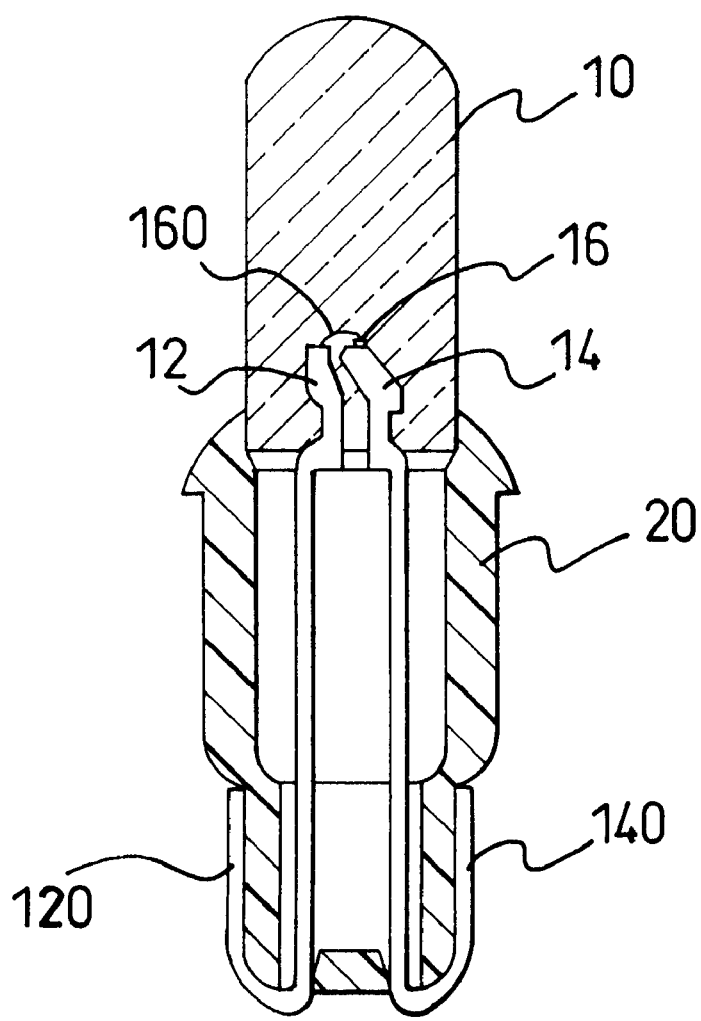
FIG. 2 is a cross-sectional view showing the configuration of the LED decorative light bulb installed in the base.

FIG. 2 shows the configuration of the LED Decorative light bulb (10) being installed in the base (20). The positive pole and the negative pole (12, 14) are contained in the epoxy resin. A crystalplate (16) is melted on the top of the negative pole (14) and a lead (160) extending therefrom is melted on the positive pole (12). The bottom of the LED Decorative light bulb (10) made of epoxide resin securely engages with the base (20), with the pair of feet (120, 140) extending out from the bottom of the base (20), then being deformed upward to follow the outer periphery of the base (20), and finally securely affixing thereon. This configuration is substantially the same as a conventional tungsten bulb and the LED Decorative light bulb (10) is now able to be inserted into a bulbholder (30) having an electric cable (32).

It should be noted that the crystalplate (16) in the invention is formed on the top of the negative pole (14) rather than on the cup as described in the prior art. In this manner the crystalplate (16) will not be shielded by the cup.

What should be mentioned here is the crystalplate (16) must be higher than the upper edge of the base (20) so as not to be obscured by the upper edge of the base (20).

Figure 3:
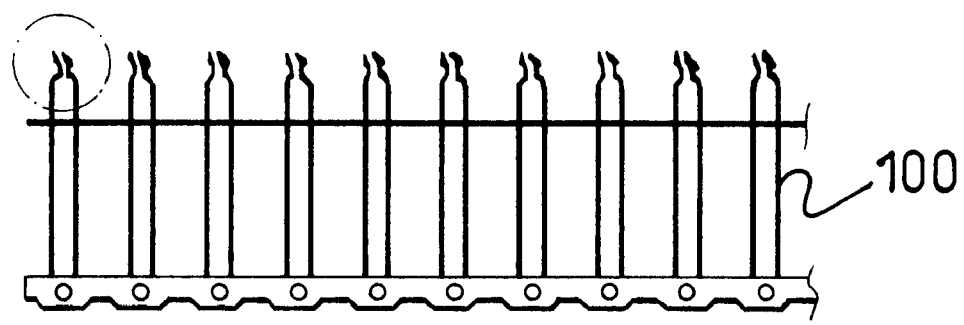
FIG. 3 is a schematic view of a frame.
Figure 4:
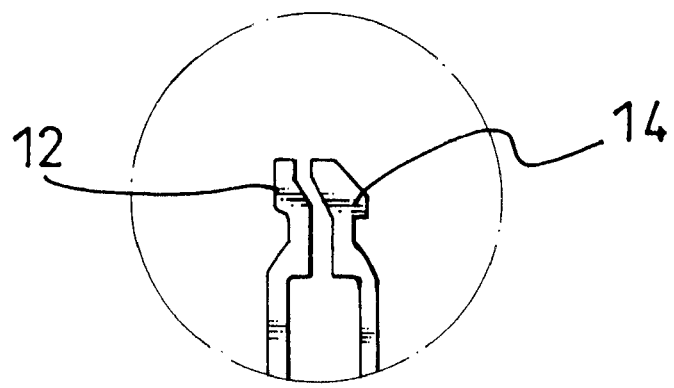
FIG. 4 is an enlarged view of a positive pole and an opposite negative pole.
Figure 5:
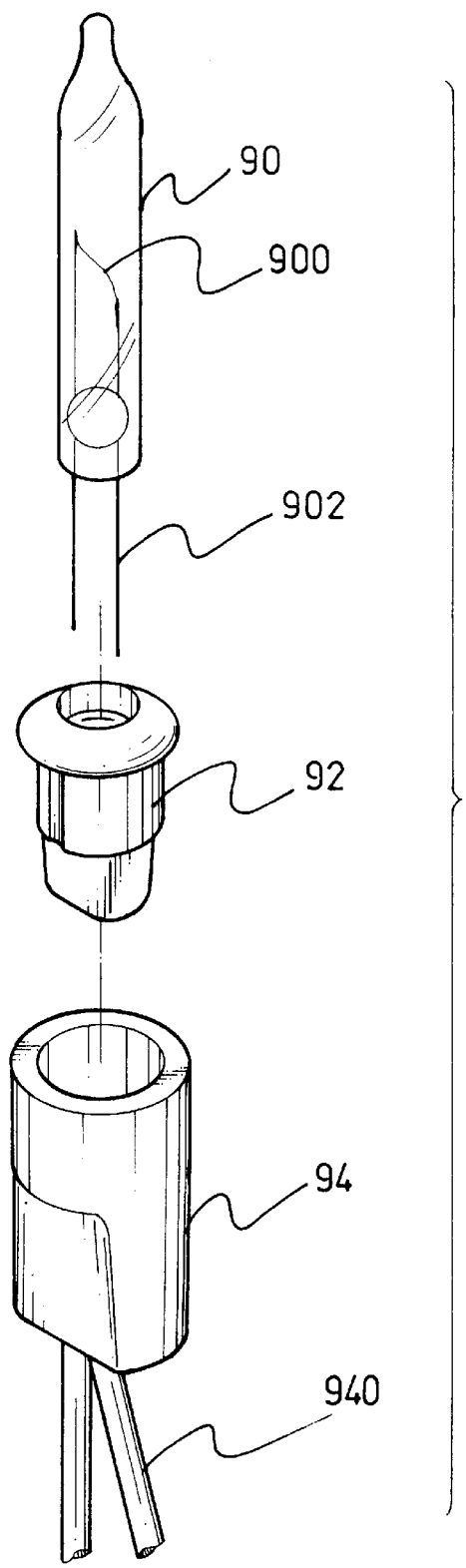
FIG. 5 is an exploded view of a present tungsten decorative light bulb.

A frame (100) shown in FIG. 3 is substantially the same as the conventional frame (80) whereas as shown in FIG. 4, there is no cup (840) defined on the top of the negative pole (14) therefor the crystalplate (16) can be molten on the top of the negative pole (14) directly.

From the above description, it is noted that in addition to lowering the manufacturing cost, the method can also produce Decorative light bulbs being compatible with conventional bases and bulbholders. In addition, by replacing the tungsten-filamented bulb with an LED bulb, the danger of glass breakage is avoided and power consumption is much lowered.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A manufacturing method of LED decorative lightbulb comprising the steps of:

a. a frame is formed having a positive pole and negative pole which are separate from each other by a certain distance;

b. the frame is copperplated;

c. the frame is nickelplated;

d. the frame is copperplated again;

e. the frame is nickelplated again to finish the processing on the frame;

f. a crystalplate is melted onto the top of the negative pole of the frame;

g. the lead is melted onto the positive pole by ultrasonic vibration;

h. the whole frame is put into a die;

i. epoxy resin is poured into the die;

j. the epoxy resin is hardened by heating it at a temperature of 130° C.;

k. the epoxy resin is allowed to cure for 8 hours;

l. the unnecessary part of the frame is removed leaving a pair of feet for electrical connection.

2. The manufacturing method as claimed in claim 1, wherein nickel aminosulfate is used in the plating solution in step c.

3. The manufacturing method as claimed in claim 1, wherein nickel aminosulfate is used in the plating solution in step e.

4. The manufacturing method as claimed in claim 1, wherein the crystalplate is made of aluminum.

* * * * *